(12) United States Patent
Ohya et al.

(10) Patent No.: US 8,425,713 B2
(45) Date of Patent: Apr. 23, 2013

(54) BONDING APPARATUS, METHOD FOR PREVENTING DISSOLVING OF ADHESIVE AGENT, AND BONDING METHOD

(75) Inventors: Satoshi Ohya, Kawasaki (JP); Atsushi Miyanari, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 175 days.

(21) Appl. No.: 12/451,629

(22) PCT Filed: Apr. 11, 2008

(86) PCT No.: PCT/JP2008/000956
§ 371 (c)(1),
(2), (4) Date: Nov. 23, 2009

(87) PCT Pub. No.: WO2008/146438
PCT Pub. Date: Dec. 4, 2008

(65) Prior Publication Data
US 2010/0096080 A1    Apr. 22, 2010

(30) Foreign Application Priority Data
May 30, 2007 (JP) ................................. 2007-143127

(51) Int. Cl.
*B32B 38/00* (2006.01)
(52) U.S. Cl.
USPC ...................................................... 156/272.6
(58) Field of Classification Search ............... 156/272.2, 156/272.6, 273.3, 273.5, 275.7, 379.6
See application file for complete search history.

(56) References Cited

U.S. PATENT DOCUMENTS

| | | | |
|---|---|---|---|
| 5,451,547 A | 9/1995 | Himi et al. | |
| 6,787,244 B2 * | 9/2004 | Sezi et al. | 428/474.4 |
| 6,897,128 B2 * | 5/2005 | Arita | 438/460 |
| 2002/0142105 A1 * | 10/2002 | Hum | 427/536 |
| 2004/0266165 A1 | 12/2004 | Utsunomiya | |
| 2005/0042881 A1 * | 2/2005 | Nishimoto et al. | 438/710 |
| 2005/0074963 A1 | 4/2005 | Fujii et al. | |

FOREIGN PATENT DOCUMENTS

| | | | |
|---|---|---|---|
| JP | 5-198549 | | 8/1993 |
| JP | 08188758 A | * | 7/1996 |
| JP | 2000-42402 | | 2/2000 |
| JP | 2002-292776 | | 10/2002 |
| JP | 2003-324042 | | 11/2003 |
| JP | 2004-349540 | | 12/2004 |
| JP | 2005-129919 | | 5/2005 |
| JP | 2005-252173 | | 9/2005 |
| JP | 2006-156683 | | 6/2006 |
| JP | 2006156683 A | * | 6/2006 |
| JP | 2006-258958 | | 9/2006 |
| TW | 1234268 | | 6/2005 |

OTHER PUBLICATIONS

Machine Translation of JP 2006156683 A, Jun. 2006.*
Machine Translation of JP8-188758, Jul. 1996.*
International Search Report issued May 20, 2008 in International (PCT) Application No. PCT/JP2008/000956.
Taiwanese Office Action issued Dec. 14, 2011 in corresponding Taiwanese Application No. 097119917, with partial English translation thereof.
Notice of Rejection Grounds issued Jul. 31, 2012 in corresponding Japanese Application No. 2007-143127, (with English translation).

* cited by examiner

*Primary Examiner* — Daniel McNally
(74) *Attorney, Agent, or Firm* — Wenderoth, Lind & Ponack, L.L.P.

(57) ABSTRACT

A bonding unit (20) bonding a wafer (12) and a support plate (14) with a mediation of an adhesive agent (16) to form a bonded substance (18), and a plasma treatment unit (22) treating the bonded substance (18) with a plasma treatment are provided.

3 Claims, 11 Drawing Sheets

F I G. 5

BONDING APPARATUS, METHOD FOR PREVENTING DISSOLVING OF ADHESIVE AGENT, AND BONDING METHOD

TECHNICAL FIELD

The present invention relates to a bonding apparatus bonding a support plate for backup on a substrate such as semiconductor wafer (hereinafter, referred to as a "wafer"), a method for preventing dissolving of an adhesive agent, and a bonding method.

BACKGROUND ART

Conventionally, while IC cards and mobile phones have been needed to be thinner and lighter, making an embedded semiconductor chip into a thin plate has been a problem to be solved, in order to meet the need. In order for that, the thickness of the wafer to be the base for the semiconductor chip has to be thin. Meanwhile, a circuit pattern is formed on the wafer.

To make the wafer thin, a method has been implemented in which a support plate having a through hole is bonded on the surface of the wafer on which the circuit pattern is formed, and after inverting it, the back surface of the wafer is ground. In addition, while the support plate for backup is bonded by an adhesive agent on the wafer that is made into a thin plate, when the separation of the wafer and the support plate is performed after predetermined processes, a dissolving solution for the adhesive agent is provided from outside of the support plate.

The dissolving solution reaches the adhesive-agent layer through the through hole formed on the support plate, and dissolves the hardened adhesive agent. The wafer thus separated from the support place is cut into respective chips by a dicing device.

Meanwhile, conventionally, when a circuit pattern is formed on a wafer, a resist resin is applied on the surface of the wafer using, for example, a spinner. However, the resist resin may attach to the end surface (edge) of the wafer or may run around and attach to the back surface of the wafer. Since the attached resist resin falls out within the apparatus and becomes a dust, it has been removed by edge rinse or back rinse, as has been well known conventionally.

However, the adhesive-agent layer is exposed in the state in which the wafer and the support plate are bonded by the adhesive agent, especially from the edge part between the wafer and the support plate. For this reason, when the resist attached to the peripheral edge surface of the wafer is removed by edge rinse in the removal process of the resist, the adhesive-agent layer is dissolved by the edge rinse. Then, the bonding strength between the wafer and the support plate decreases, and causes a disadvantage when the wafer is ground by a grinder and made into a thin plate. Furthermore, since the wafer and the support plate go through a various process in a state in which they are bonded, the resistance of the adhesive-agent layer is required against chemicals and the like used in the various processes.

DISCLOSURE OF INVENTION

The present invention provides a bonding apparatus that makes a wafer and a support plate bonded by an adhesive agent resistant to falling off especially in the process to make the wafer into a thin plate, a method for preventing the adhesive agent from dissolving, and a bonding method.

A bonding apparatus of the present invention is a bonding apparatus bonding a support plate on a wafer, characterized in that it has a plasma treatment unit.

A bonding apparatus of the present invention is characterized in that it has a bonding unit bonding a wafer and a support plate with a mediation of an adhesive agent to form a bonded substance; and a plasma treatment unit treating the bonded substance with a plasma treatment.

A bonding apparatus of the present invention is characterized in that it has a bonding unit bonding a wafer and a support plate with a mediation of an adhesive agent to form a bonded substance; and a plasma treatment unit treating the support plate and the bonded substance with a plasma treatment.

A bonding method of the present invention is a bonding method of a wafer and a support plate, characterized in that it has a bonding process for bonding a wafer and a support plate with a mediation of an adhesive agent to form a bonded substance; and a fluorine-plasma treatment process for treating the bonded substance with a fluorine-based plasma.

A bonding method of the present invention is a bonding method of a wafer and a support plate, characterized in that it has an oxygen-plasma treatment process for treating a support plate with an oxygen plasma; and a bonding process for bonding a wafer and the support plate with a mediation of an adhesive agent to form a bonded substance.

A bonding method of the present invention is a bonding method of a wafer and a support plate, characterized in that it has an oxygen-plasma treatment process for treating a support plate with oxygen plasma; a bonding process for bonding a wafer and the support plate with a mediation of an adhesive agent to form a bonded substance; and a fluorine-plasma treatment process for treating the bonded substance with a fluorine-based plasma.

A method for preventing dissolving of an adhesive agent placed between a wafer and a support plate of the present invention is a method for preventing dissolving of an adhesive agent placed between a wafer and a support plate, characterized in, after bonding the wafer and the support plate while placing the adhesive agent between the wafer and the support plate, treating an exposed part of the adhesive agent with a fluorine-based plasma treatment.

According to the present invention, by treating an bonded substance in which a wafer and a support plate is bonded by an adhesive agent with a plasma treatment, the dissolving of the adhesive agent by a dissolving solution for resist removal can be prevented. By this, even when such a dissolving solution is applied to the bonded substance, the bonding strength between the wafer and the support plate can be maintained.

BEST MODE OF CARRYING OUT THE INVENTION

Hereinafter, an embodiment of the present invention is illustrated.

Figure 1:
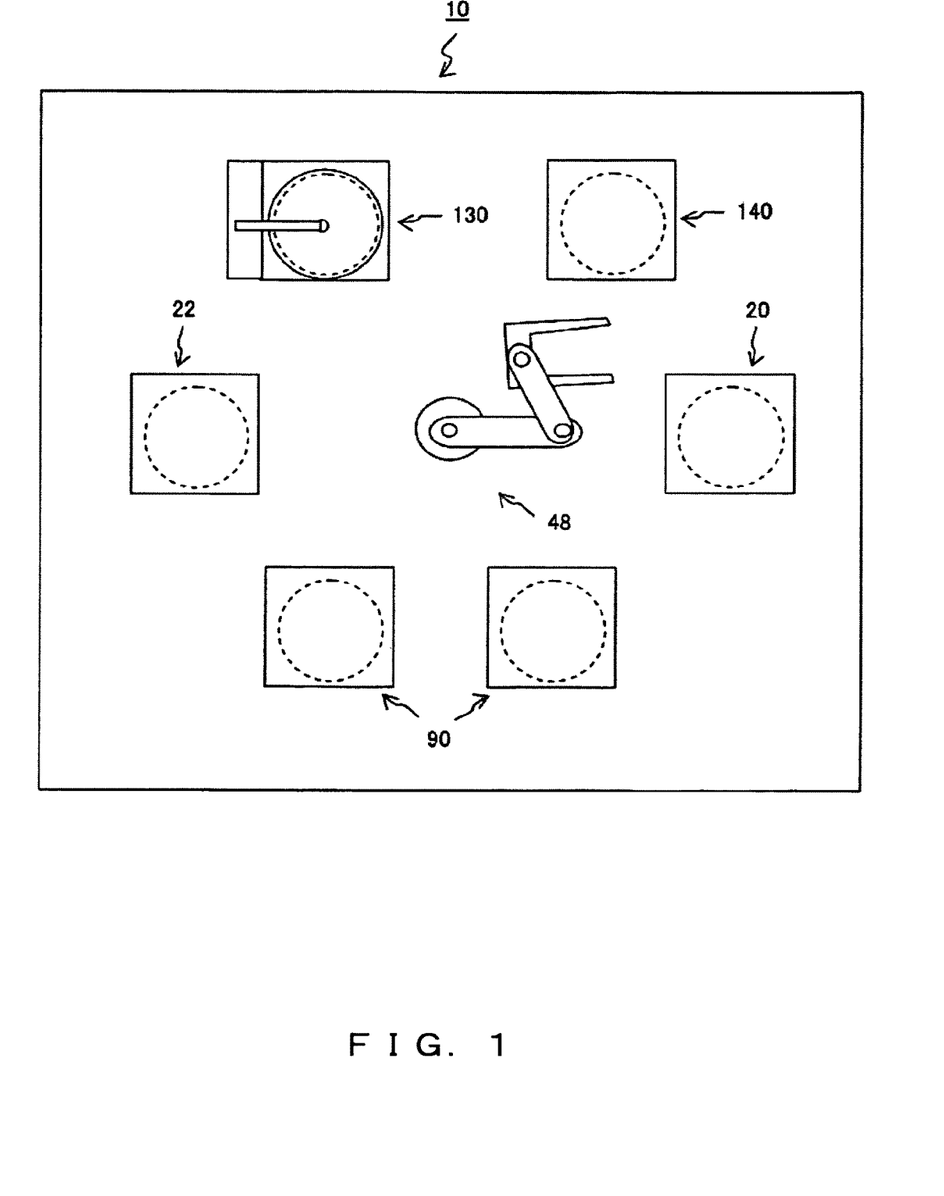
FIG. 1 is a diagram illustrating the overall configuration of the bonding apparatus of the embodiment.

FIG. 1 is a diagram illustrating an example of the configuration of the bonding apparatus according to the present invention.

A bonding apparatus of 10 of the present invention has a cassette 90 storing a support plate and a wafer, a coating unit 130 applying an adhesive agent on the support plate and/or the wafer, a baking unit 140 baking the adhesive agent applied on the support plate and/or the wafer, a bonding unit 20 bonding the wafer and the support plate by an adhesive agent to create a bonded substance, a plasma treatment unit 22 treating the support plate and/or the bonded substance with a plasma treatment, and a carrying unit 48 carrying the support plate, the wafer and the bonded substance.

The operations in the bonding apparatus are as described below.

A support plate and/or a wafer stored in the cassette 90 are carried to the coating unit 130 by the carrying unit 48. The carrying unit 48 is, for example, a robot hand and the like. The coating unit 130 applies an adhesive agent on the carried-in support plate and/or wafer. Meanwhile, when an adhesive agent is applied on a wafer, the application is performed on the surface of the wafer on which the circuit pattern is formed. The application is performed by, for example, spin coating, and the coat unit 130 may be a spin coating apparatus and the like.

The support plate and/or wafer described above on which the adhesive agent is applied are carried to the baking unit 140 by the carrying unit 48. The baking unit 140 bakes the carried-in support plate and/or wafer. The baking unit 140 hardens the adhesive agent by heating it to a predetermined temperature. Meanwhile, a vacuum pump may be provided so that the heating can be performed under reduced pressure. As the heating temperature, for example, about 150-200° C. is preferable.

The baked support plate and/or wafer are carried to the bonding unit 20 by the carrying unit 48. The bonding unit 20 layers the support plate and the wafer with a mediation of an adhesive agent to create a bonded substance. In the bonded substance, the surface of the wafer on which the circuit is formed faces the adhesive agent. The bonding unit 20 has a pair of press plates that are capable of heating for example, and the support plate and wafer layered with a mediation of the adhesive agent is placed between the press plate, and the bonded substance is created by performing pressure bonding while applying heat. It is preferable to reduce pressure with the pressure bonding, and in this case, it is preferable that a vacuum pump is provided.

In the bonding apparatus 10 described above, the bonded substance is carried to the plasma treatment unit 22 by the carrying unit 48. The plasma treatment unit 22 treats the bonded substance with a fluorine-based plasma. The plasma treatment unit 22 has a plasma treatment device. The plasma treatment device is a device that applies a high-frequency voltage between electrodes and generates plasma using etchant.

Here, a case of using a support plate with holes as the support plate is explained as an example.

Figure 5:
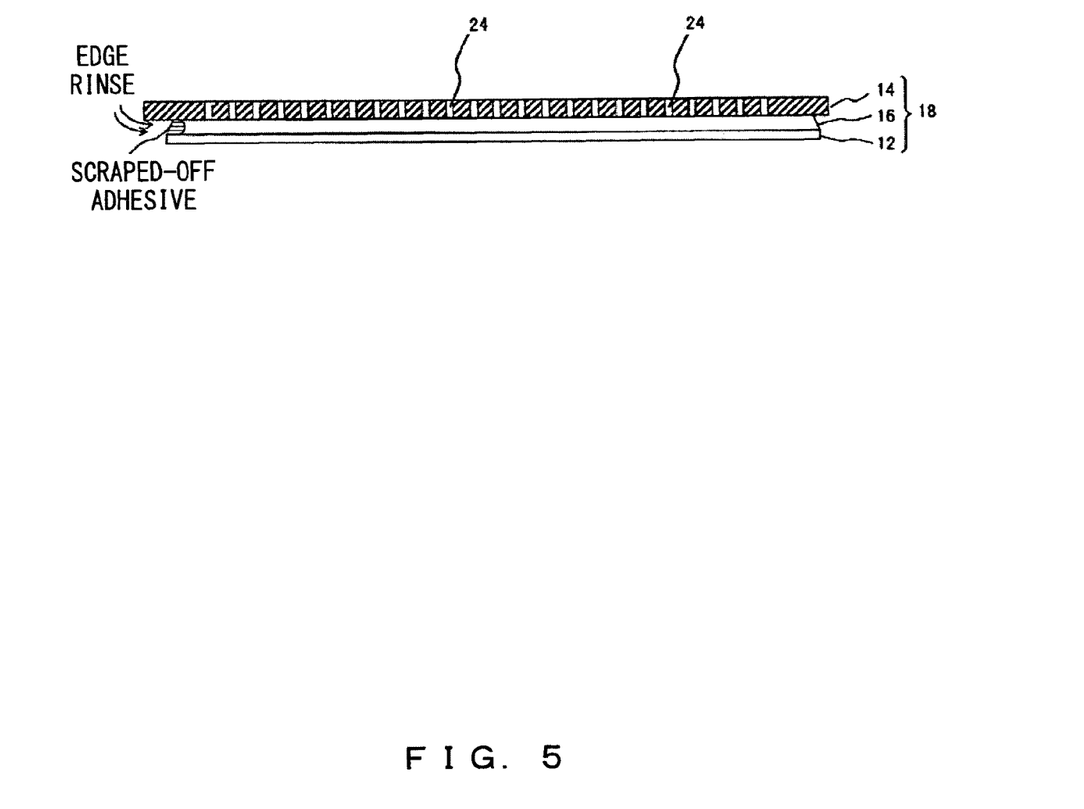
FIG. 5 is a cross-section diagram of a state in which a support plate is bonded on a wafer in the embodiment.

As illustrated in FIG. 5, in the bonded substance created in the bonding unit 20, the layer of an adhesive agent 16 are exposed at the edge part between the respective peripheral parts of a wafer 12 and a support plate 14, and in a through hole 24. Therefore, if a chemical such as edge rinse for removing the resist contacts the edge part or the through hole 24, there is a risk that a part of the exposed adhesive agent 16 is scraped off. In order to prevent this, in the present embodiment, a plasma treatment is performed for the exposed part of the adhesive agent 16. By the plasma treatment, the chemical resistance of the exposed part of the adhesive-agent layer is improved, making it possible to prevent the disadvantage that the exposed part is scraped off. The chemical resistance seems to be improved because the exposed part is fluorinated by the fluorine plasma treatment and a film (coating film) of a fluoride is formed on the surface of the adhesive-agent layer. Furthermore, since the chemical resistance is improved, the decline of the bonding strength between the wafer 12 and the support plate 14 can be prevented. When a support plate with holes is used, it is preferable to perform the plasma treatment while the support plate is put on top to so that the plasma easily reaches the exposed part. Meanwhile, while the case of using a support plate with holes as the support plate has been described above, a similar effect can be obtained in a case of using a support plate without holes, since the edge part has an exposed part.

Meanwhile, in addition to the above configuration, it is preferable to treat the surface of the support plate that contacts the adhesive agent and/or the surface of the wafer that contacts the adhesive agent (the surface of the wafer on which the circuit is formed) with an $O_2$ plasma, and it is preferable that in the plasma treatment unit 22, a fluorine-based plasma or an oxygen plasma can be generated by switching between a fluorine-based gas and an oxygen-based gas. Meanwhile, both a fluorine-based plasma treatment device and an $O_2$ plasma treatment device may be disposed. As the timing to treat the support plate and/or the wafer with an $O_2$ plasma, immediately before the adhesive agent is applied in the coating unit, or immediately before the support plate and the wafer are layered in the bonding unit is preferable.

By the $O_2$ plasma treatment described above, the application property to the support plate and/or the wafer is improved, and the bonding property of the support plate and/or the wafer and the adhesive agent is also improved. This seems to be because the $O_2$ plasma improves the hydrophilic property of the support plate and/or the wafer, improving the application property of the adhesive agent and also the adhesion. Furthermore, organic substances attached to the surface can also be removed by $O_2$ plasma, adding a cleaning property.

While the bonding unit and the plasma treatment unit are provided separately in the configuration described above, a plasma generation device may be integrated into the bonding unit, and the plasma treatment may be performed in the bonding unit.

Here, the process of obtaining a semiconductor chip by bonding the wafer 12 and the support plate 14 and making the wafer 12 into a thin plate is explained.

FIG. 2A-FIG. 2G are diagrams illustrating the processes of bonding the wafer 12 and the support plate 14 by the adhesive agent 16, making the wafer 12 into a thin plate, and cutting into a semiconductor chip.

Figure 2A:
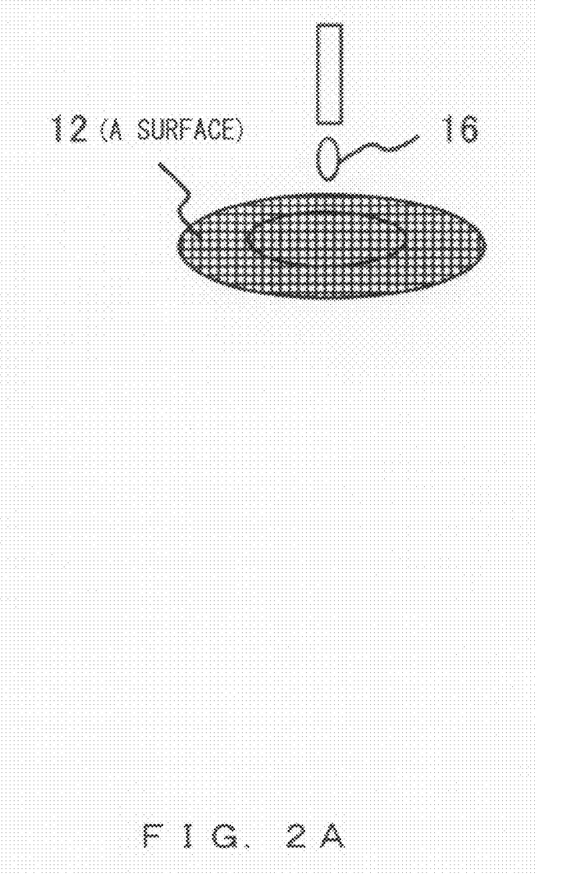
FIG. 2A is a diagram illustrating the process of applying an adhesive agent on a wafer.

As illustrated in FIG. 2A, the liquid of the adhesive agent 16 is applied to the surface of the wafer 12 on which the circuit pattern is formed (A surface of the wafer) by an application unit, and the liquid of the adhesive agent 16 is dried. By this, the liquidity of the adhesive agent 16 is reduced, and a layer of the adhesive agent 16 is formed on the A surface of the wafer 12.

Meanwhile, the thickness of the layer of the adhesive agent 16 is determined in accordance with the concavity and convexity of the circuit formed on the A surface of the wafer 12. In addition, if the thickness in accordance with the concavity and convexity cannot be realized by one application, the application and drying of the adhesive agent 16 is repeated for a plurality of times.

Figure 2B:
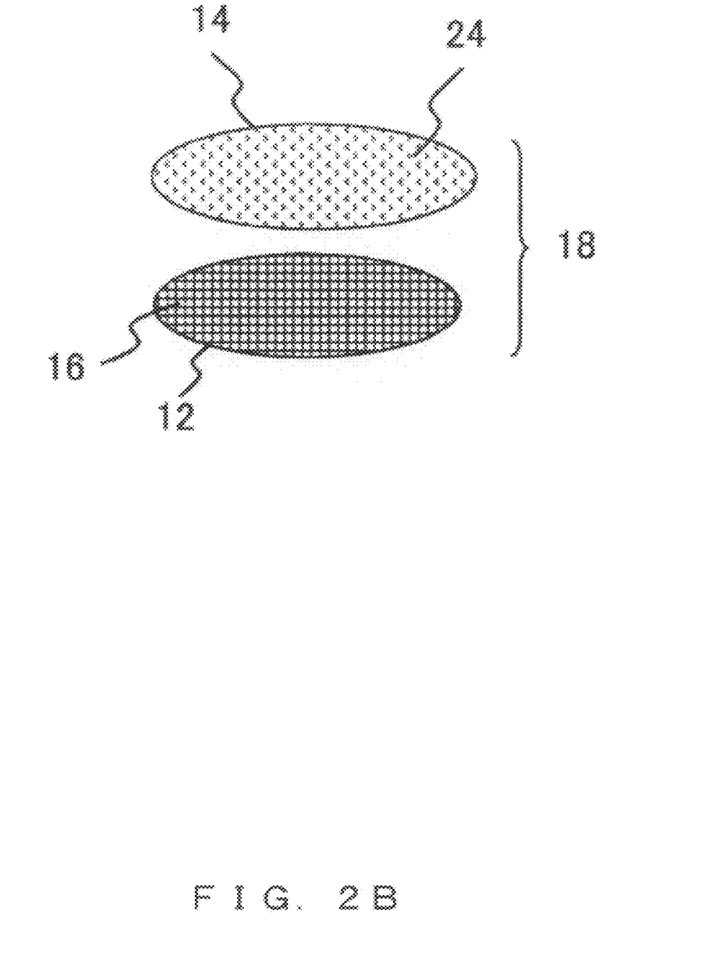
FIG. 2B is a diagram illustrating the process of bonding and combining a wafer and a support plate.

Next, as illustrated in FIG. 2B, the wafer 12 on which the layer of the adhesive agent 16 is formed and the support plate 14 are layered and bonded, combining them to form a bonded substance 18. The combination in this way is performed in order to back up (reinforce), by the support plate 14, the wafer 12 that has a thin and susceptible-to-fracture property.

Figure 3:
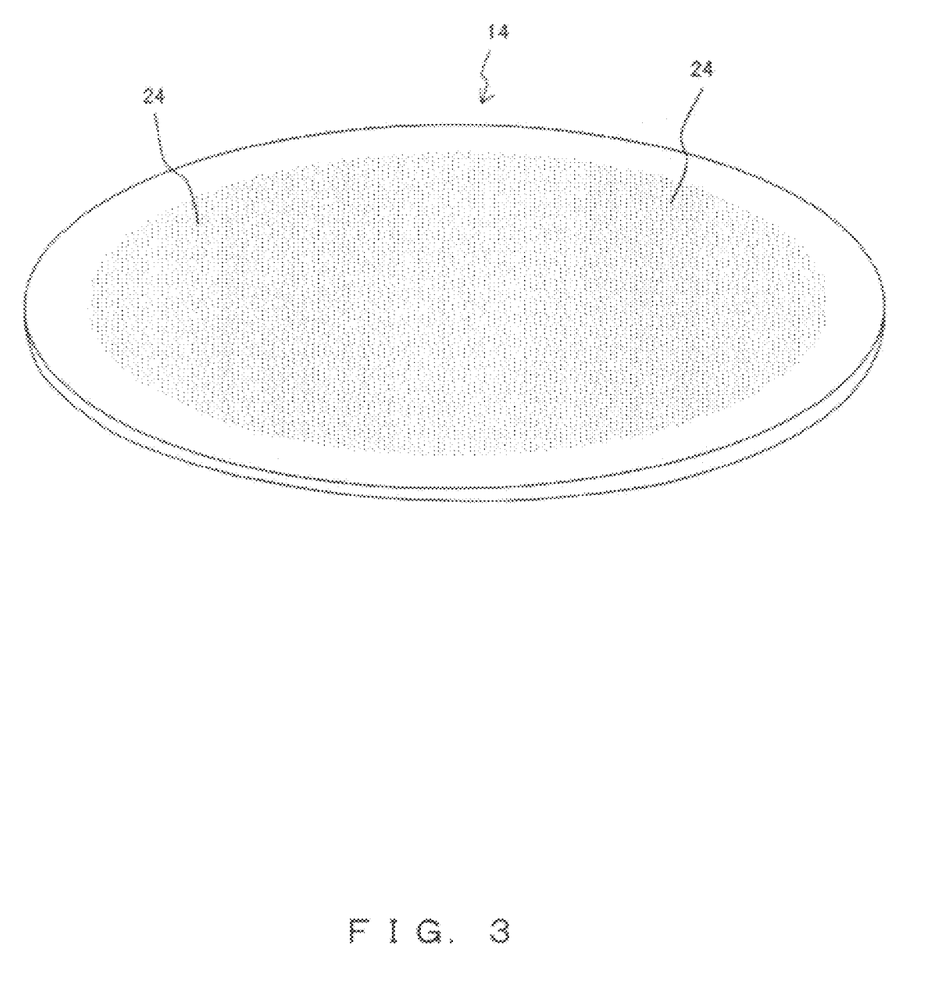
FIG. 3 is a perspective diagram of a support plate in the embodiment on which through holes are formed.
Figure 4:
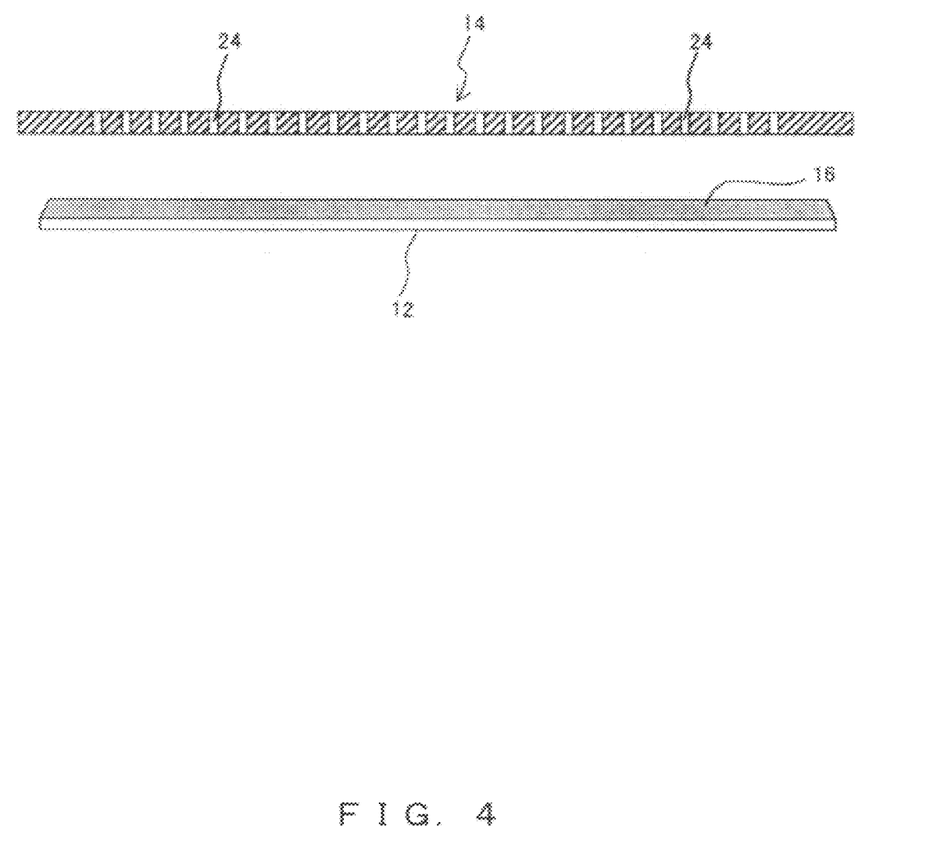
FIG. 4 is a cross-section diagram of a state in the embodiment before bonding in which a support plate is put on a wafer.

Here, for the support plate 14, as illustrated in FIG. 3 and FIG. 4, the one having a larger dimension than that of the wafer 12, and having the thickness of, for example, approximately 0.5 mm is used. A number of through holes 24 penetrating in the thickness direction are formed on the support plate 14. The material of the support plate 14 may be, for example, glass, silicone, ceramic, iron-nickel alloy and the like.

The through hole 24 is used when the support plate 14 and the wafer 12 are separated by dissolving the adhesive agent 16 that is bonding them. That is, when a dissolving solution is applied from above the support plate 14, the dissolving solution reaches the adhesive agent through the through hole 24, and dissolves the adhesive agent 16 to effectively separate the support plate 14 and the wafer 12. Meanwhile, in the case of the support plate 14 that does not have the through hole 24, the dissolving solution seeps into the adhesive agent 16 from between the support plate 14 and the wafer 12.

Meanwhile, as the diameter of the through hole 24, 0.2 mm-0.7 mm, for example, and as the pitch of the through hole 24, 0.3 mm-1.0 mm, for example, is supposed to be appropriate.

Figure 2C:
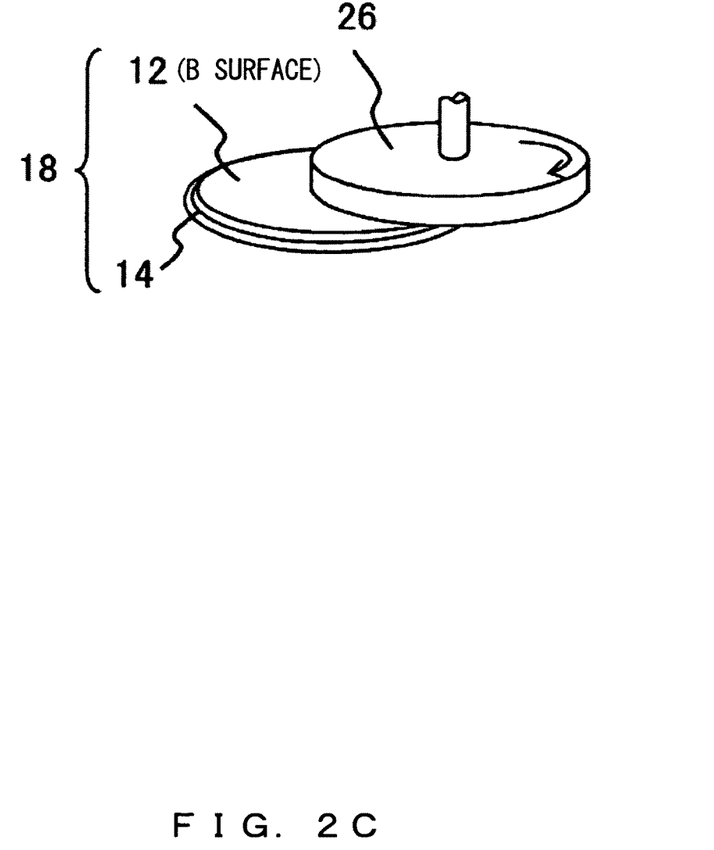
FIG. 2C is a diagram illustrating the process of grinding the wafer after combining a wafer and a support plate.

Next, as illustrated in FIG. 2C, after the support plate 14 and the wafer 12 are combined, the surface (B surface of the wafer 12) opposite to the surface on which the support plate 14 is bonded is ground by a grinder 26 to make the wafer 12 into a thin plate.

Figure 2D:
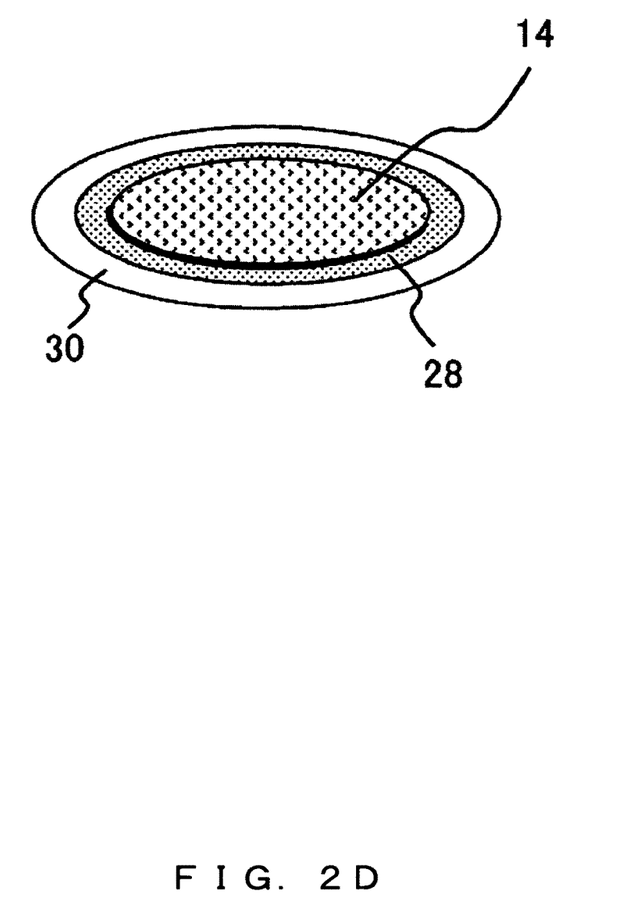
FIG. 2D is a diagram illustrating the process of fixing a wafer combined with a support plate on a dicing tape.

Next, as illustrated in FIG. 2D, on the wafer 12 that has been made into a thin plate, the surface (B surface of the wafer 12) opposite to the surface on which the support plate 14 is bonded is fixed on a dicing tape 28. The dicing tape 28 has an adhesive property and is held on a frame 30.

Figure 2E:
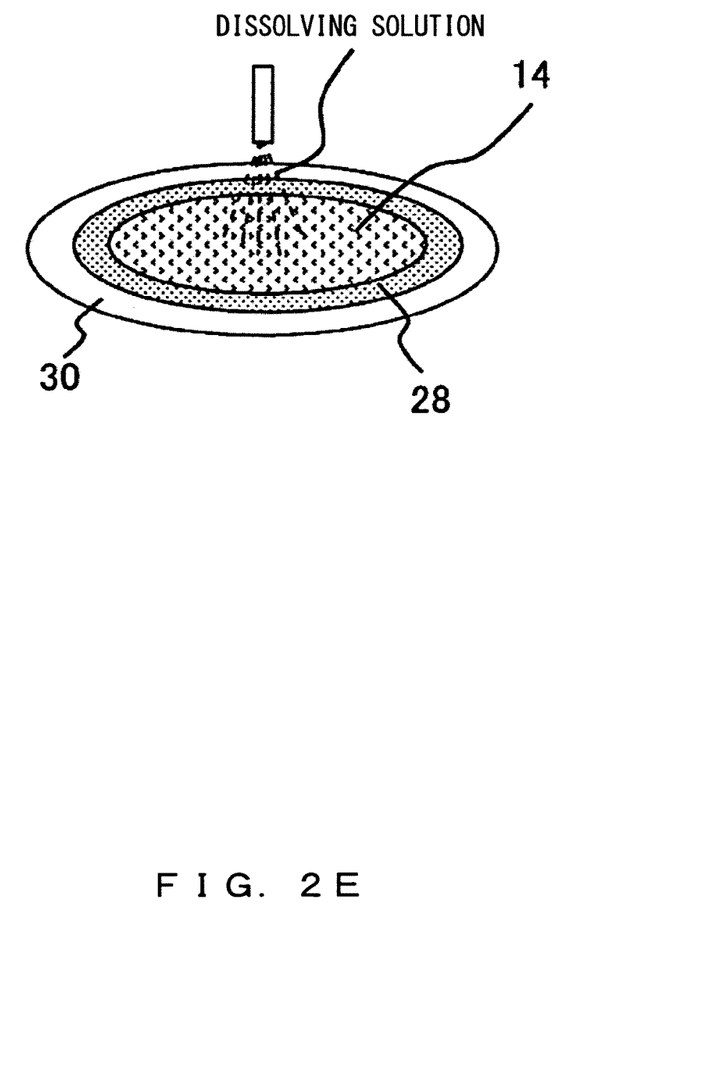
FIG. 2E is a diagram illustrating the process of applying a dissolving solution from above the support plate combined with a wafer.

After that, as illustrated in FIG. 2E, a dissolving solution is applied from above the support plate 14. Then, the dissolving solution reaches the adhesive agent 16 through the through hole 24 of the support plate 14, and dissolves the adhesive agent 16.

Figure 2F:
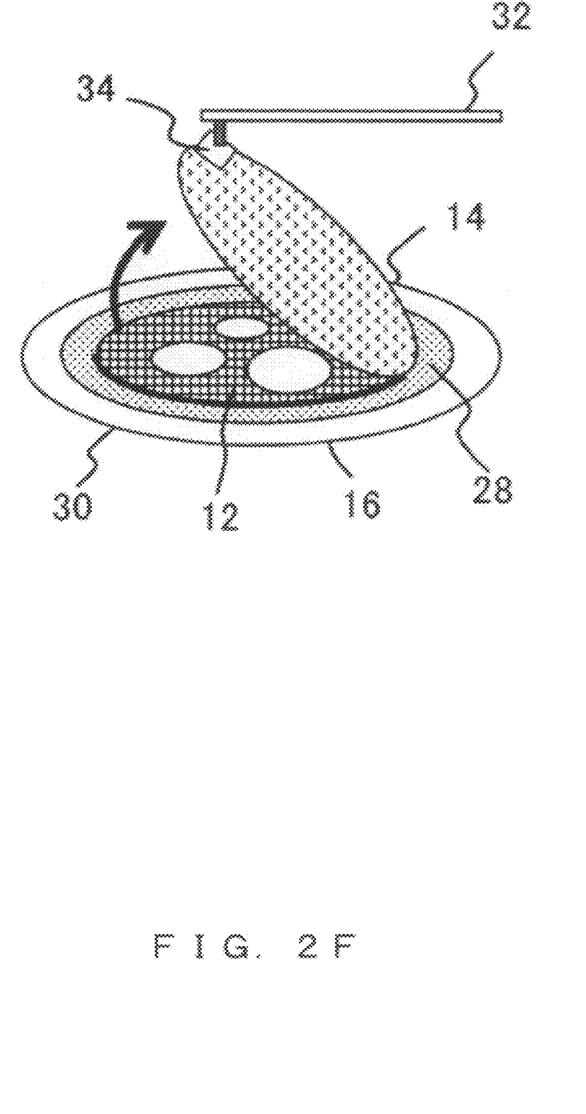
FIG. 2F is a diagram illustrating the process of separating a support plate and a wafer.

After that, as illustrated in FIG. 2F, the support plate 14 and the wafer 12 that has been made into a thin plate are separated. In that case, when a magnet material such as iron-nickel alloy for example is used for the support plate 14, the support plate 14 is attached to a magnet 34 that is disposed on an end of an arm 32. Next, by pulling the arm 32 obliquely upward, the support plate 14 can be separated from the wafer 12 gradually from the peripheral part.

Meanwhile, there is no particular limitation on the separation method. For example, the separation may be performed by inserting, between the support plate 14 and the wafer 12, a nail-like jig attached to an end of the arm 32, and hooking it on the edge surface of the support plate 14. Other than that, a separation method in which vacuum absorption is performed on the surface on which the dicing tape 28 is attached is possible.

Figure 2G:
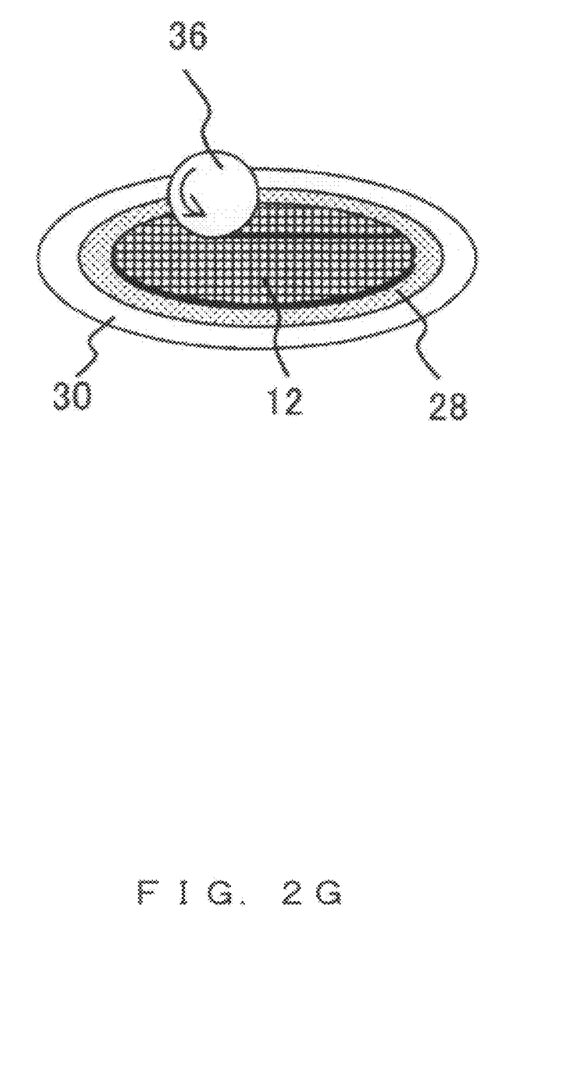
FIG. 2G is a diagram illustrating the process to cut the wafer in a chip size.

Next, as illustrated in FIG. 2G, after the support plate 14 is separated, the adherend surface of the wafer 12 is cleaned, and the wafer 12 is cut in the chip size by a dicing device 36. After the cutting, the dicing tape 28 is irradiated with ultraviolet light to decrease the adherence of the dicing tape 28, and the cut chips are taken out respectively.

(Evaluation of the Chemical Resistance with a Fluorine-Based Plasma Treatment for the Adhesive Agent)

A sample was prepared, and its chemical resistances against a dissolving solution in a case in which the sample was treated with a fluorine-based plasma and in a case without the treatment were compared for evaluation.

As the sample, an acrylic adhesive agent is applied on a 6-inch silicone (Si) wafer, which was baked at 110° C., 150° C., 200° C. for 180 minutes respectively to form an adhesive-agent layer, and then cut into an approximately-20 mm square and used.

As the plasma treatment device, TCA-2400 (made by TOKYO OHKA KOGYO CO., LTD.) was used. The treatment conditions were, $CF_4/O_2$=180/20 sccm, RF300W, pressure 300(mTorr), temperature 60° C. In addition, the fluorine-plasma treatment times were, 30 seconds, 60 seconds, and 180 seconds.

In addition, as the dissolving solution, two kinds, namely, PGMEA (Propylene Glycol Monoethyl Ether Acetate) and acetone were used. The dissolving solutions were used at a solution temperature of 22° C.

The evaluation was performed by the change in the film thickness of the adhesive-agent layer of the sample after 5 minutes and 10 minutes after it is immersed in the dissolving solution. The film thickness was measured at 17 points on the surface, and their average value was obtained. Meanwhile, the adhesive-agent layer of the sample was 15.8 μm.

First for the comparison, in the case without the fluorine-based plasma treatment, the adhesive agent was dissolved by both PGMEA and acetone after the immersion for 5 minutes, and the film thickness was 0 μm.

On the other hand, for the one treated with the fluorine-based plasma treatment, although a swelling of 0.1-0.2 μm of the film was observed, there was almost no change in the film thickness for all the treatments for 30 seconds, 60 seconds, and 180 seconds, so the chemical resistance was improved. In addition, while some cracks were observed on the surface of the adhesive-agent layer, the occurrence of the crack was suppressed better when the fluorine-based plasma treatment time was longer.

The invention claimed is:

1. A wafer and a support plate bonding method, comprising:
   bonding a wafer and a support plate with a mediation of an adhesive agent to form a bonded substance; and
   after bonding the wafer and the support plate, treating an exposed part of the adhesive agent with a fluorine-based plasma treatment to improve chemical resistance of the exposed part of the adhesive agent against a dissolving solution and thus prevent a part of the adhesive agent from being scrapped off by a chemical treatment which uses the dissolving solution.

2. A wafer and a support plate bonding method, comprising:
- treating a support plate with an oxygen plasma;
- bonding a wafer and the support plate with a mediation of an adhesive agent to form a bonded substance; and
- after bonding the wafer and the support plate, treating an exposed part of the adhesive agent with a fluorine-based plasma treatment to improve chemical resistance of the exposed part of the adhesive agent against a dissolving solution and thus prevent a part of the adhesive agent from being scrapped off by a chemical treatment which uses the dissolving solution.

3. A method for preventing an adhesive agent placed between a wafer and a support plate from dissolving, comprising:
- providing a wafer and support plate with adhesive agent between the wafer and the support plate, and treating an exposed part of the adhesive agent with a fluorine-based plasma treatment to improve chemical resistance of the exposed part of the adhesive agent against a dissolving solution and thus prevent a part of the adhesive agent from being scrapped off by a chemical treatment which uses the dissolving solution.

* * * * *